United States Patent
Balke et al.

(10) Patent No.: US 7,489,146 B2
(45) Date of Patent: Feb. 10, 2009

(54) V/I SOURCE AND TEST SYSTEM INCORPORATING THE SAME

(75) Inventors: Christian Balke, Munich (DE); Cristo da Costa, Unterhaching (DE)

(73) Assignee: Teradyne, Inc., North Reading, MA (US)

( * ) Notice: Subject to any disclaimer, the term of this patent is extended or adjusted under 35 U.S.C. 154(b) by 161 days.

(21) Appl. No.: 11/645,430

(22) Filed: Dec. 26, 2006

(65) Prior Publication Data

US 2007/0210810 A1    Sep. 13, 2007

(30) Foreign Application Priority Data

Mar. 9, 2006    (EP) .................. 06004879

(51) Int. Cl.
*G01R 27/08*    (2006.01)
*G01R 31/28*    (2006.01)
*H03K 17/74*    (2006.01)

(52) U.S. Cl. ............... 324/713; 324/73.1; 324/158.1; 327/494

(58) Field of Classification Search .......... 324/713, 324/691, 649, 600, 73.1, 158.1, 763, 765; 327/423, 478, 494
See application file for complete search history.

(56) References Cited

U.S. PATENT DOCUMENTS

| | | | | |
|---|---|---|---|---|
| 4,437,096 A * | 3/1984 | Brightman et al. | .......... | 379/335 |
| 4,720,671 A * | 1/1988 | Tada et al. | .......... | 324/73.1 |
| 5,010,297 A * | 4/1991 | Babcock | .......... | 324/763 |
| 5,493,519 A * | 2/1996 | Allen, III | .......... | 702/120 |
| 5,952,821 A * | 9/1999 | Gillette | .......... | 324/158.1 |
| 6,211,723 B1 * | 4/2001 | Creek | .......... | 327/494 |
| 6,498,473 B1 * | 12/2002 | Yamabe | .......... | 324/158.1 |
| 6,639,397 B2 * | 10/2003 | Roth et al. | .......... | 324/158.1 |
| 6,861,893 B2 * | 3/2005 | Kohsiek | .......... | 327/494 |
| 7,129,695 B2 * | 10/2006 | Roth | .......... | 324/158.1 |
| 7,268,525 B2 * | 9/2007 | Ishii et al. | .......... | 323/282 |
| 7,348,910 B2 * | 3/2008 | Seifu et al. | .......... | 341/144 |
| 2005/0146320 A1 * | 7/2005 | Gohel | .......... | 324/158.1 |

FOREIGN PATENT DOCUMENTS

| | | |
|---|---|---|
| EP | 1450172 A | 8/2004 |
| EP | 1550877 A | 7/2005 |

OTHER PUBLICATIONS

EP Search Report in Application No. EP 06004879.0, dated Jul. 24, 2006 (3 pgs).
International Search Report for Application No. PCT/US2006/044343.
Written Opinion for Application No. PCT/US2006/044343.

* cited by examiner

*Primary Examiner*—Vincent Q Nguyen
*Assistant Examiner*—Hoai-An D Nguyen
(74) *Attorney, Agent, or Firm*—Fish & Richardson P.C.

(57) ABSTRACT

A voltage/current (V/I) source includes circuitry having first, second, third and fourth nodes, a first current source electrically connected to the first node, a second current source electrically connected to the second node, where the third and fourth nodes are between the first and second nodes, and an operational amplifier (op-amp) having an output, an inverting input, and a non-inverting input. The output is electrically connected to the third node, and the non-inverting input is electrically connected to a voltage source. A feedback line is between the fourth node and the inverting input.

26 Claims, 4 Drawing Sheets

V/I SOURCE AND TEST SYSTEM INCORPORATING THE SAME

BACKGROUND OF THE INVENTION

1. Field of the Invention

The present invention relates generally to a V/I source and more particularly, to automatic test systems for electronic devices containing a V/I source. The invention furthermore relates to a method for forming a V/I source and a method for testing an electronic device. Specifically, the V/I source of the present invention is capable of selectively providing predetermined output loads or output voltages to a device under test (DUT).

2. Description of Related Art

Automatic test equipment is frequently employed to run diagnostic tests on integrated circuit devices. In this respect, the test equipment for example ensures that integrated circuits under test provide the proper output voltages in response to a given input by the test equipment during a functional test. The test equipment can also provide parametric tests for determining electrical characteristics of a device such as resistance and leakage.

Automatic test systems commonly employ circuits for communicating electronic signals with devices to be tested. Devices under test (DUT's) typically include many input/output nodes having similar electronic interface characteristics. Therefore, tester circuits that communicate with these nodes tend to be identical. Testers generally include tens or even hundreds or more of identical, general-purpose interface circuits known in the art as "pin electronics" circuits. Pin electronics circuits, also called "channels," can differ widely in construction, but most commonly include three basic elements: a driver, a detector, and an active load.

The driver is a source of electronic signals. Typically, drivers are optimized for producing digital signals, which are either high (logic 1) or low (logic 0). Drivers are commonly designed to switch their outputs between predetermined high and low levels under strict timing control.

The detector is a receiver of electronic signals. It receives a signal from the DUT and indicates the state of that signal at particular instants in time.

The active load is a provider/dissipater of electrical energy. The active load subjects output signals of the DUT to loading conditions (e.g., sourcing or sinking current) that are similar to those expected during the DUT's normal operating conditions. Such active loads are generally programmable and the levels of currents they provide/absorb (source and/or sink) can be adjusted.

Test systems generally include timing circuitry for synchronizing drivers, detectors, and active loads. Signals are generated, signals are detected, and loads are applied under strict timing control.

FIG. 1 shows a simplified schematic of a pin electronics channel 110 of the type described above, wherein the channel 110 is connected to a pin of a DUT 120 for performing tests on the DUT. The channel 110 includes a driver 112, a detector 114, and an active load 116. In practice several channels 110 may be connected to a DUT, depending on the amount of driver signals required and the amount of output signals to be detected. Each channel 110 may selectively act as a driver or a detector/load. In the configuration shown in FIG. 1, two channels 110 are provided, wherein for the upper one acts as a driver, while the lower one acts as a detector, as will be described above. The driver 112 of the upper channel 110 supplies a test signal to an input circuit 122 of the DUT, such as the input of a latch. The detector 114 of the lower channel 110 receives an output signal from an output circuit 124 of the DUT, such as the output of a latch. The active load 116 of the lower channel typically also receives the output signal and depending on the output signal absorbs current from the output circuit 124 or supplies current thereto. Test systems generally include a great number of channels like the channel 110, and those channels can be connected to large numbers of input and output circuits of a DUT. This arrangement is merely an example of how a driver, detector, and active load can be used when testing a device. Other arrangements are common.

While channels 110 may be used for functional tests of a DUT, they are typically not capable of performing parametric tests thereon. Thus, in the past, separate parametric measuring units (PMU's) 130 have been used. Inasmuch as functional tests can typically be performed much faster than parametric tests, a single PMU may be assigned to several pins of a DUT 120. The PMU 130 may be connected to a DUT via respective switches 135, 136. During parametric measurements it may be required to disconnect the channels 110 from the DUT, which may be achieved via respective switches 140.

FIG. 2 shows a more detailed view of a typical active load 116 used in automatic test equipment. The active load 116 includes a pair of programmable current sources 210 and 212 that connect to opposite ends of a diode quad 216. One side of the diode quad 216 receives a programmable signal, VCOM, via a respective device 214. The other side of the diode quad (node 220) is adapted to receive a signal to be loaded from a DUT.

The active load 216 operates generally as follows. Assuming that the currents from the current sources 210 and 212 are equal and the node 220 is open, all current flowing into the top of the diode quad 216 flows out the bottom of the diode quad 216. The current divides approximately equally between the left and right sides of the diode quad, i.e., the same current flows through diodes 216a and 216d as flows through diodes 216b and 216c. Because all diodes 216a-216d are conductive, the voltage VCOM applied to the left of the diode quad is approximately duplicated to the right of the diode quad.

If an output signal, such as from a DUT, is now applied to node 220, the balanced state of the diode quad is disturbed. When the voltage at node 220 exceeds VCOM, diode 216a is cut off (reverse-biased) and the current source 212 sinks all of its current from the DUT via diode 216b. Diode 216c is also cut off, and the current source 210 supplies all of its current to VCOM. When the voltage at node 220 is less than VCOM, diodes 216b and 216d are cut off. All current from the current source 210 is sourced to the DUT, and all the current to the current source 212 is sourced from VCOM.

The effect of this behavior is that the DUT sources the current of the current source 212 when its output is higher than VCOM, and sinks the current of current source 210 when its output is lower than VCOM.

The currents of the current sources 210 and 212 need not be the same. For instance, if the current through the current source 210 is greater than the current through the current source 212, the DUT is forced to sink a greater current when outputting a low signal than it is forced to source when outputting a high signal.

Such a load is well suited for loading the output of a DUT for functional tests thereon. Such a load, however, is not well suited for parametric measurements. During parametric measurements it may for example be necessary to force a predetermined current through a DUT (for example a diode) and to measure the voltage drop there across (force current/measure voltage). Additionally it may be necessary to create a predetermined Voltage across a DUT (for example a resistor or a reverse diode) and to measure the current or leaking current flowing therethrough (force voltage/measure current). Though the known load circuit is capable of providing (forcing) a predetermined current, it is not capable of providing (forcing) a predetermined voltage to a DUT. Therefore, different and separate circuits, especially different driver and load circuits had to be provided for different types of tests, leading to a high count of components in the automatic test equipment.

Furthermore, in the force current/measure voltage situation it may be necessary to limit the maximum voltage applied across the DUT, in order to protect the DUT and the automatic test equipment (e.g. in an open circuit situation).

In the force voltage/measure current situation it is necessary to limit the current flowing through the DUT, in order to protect the DUT and the automatic test equipment (e.g. in a short circuit situation).

BRIEF SUMMARY OF THE INVENTION

With the foregoing background in mind, there appears to be a need to provide a simple load/supply circuit capable of selectively providing a predetermined current or a predetermined voltage. A further need appears to be a load/supply capable of limiting its voltage output when providing a predetermined current and of limiting its current output when providing a predetermined voltage.

In accordance with the embodiments described herein, a V/I source is provided comprising a diode quad having first through fourth nodes, a first current source connected to a $1^{st}$ node of said diode quad, a second current source connected to a $2^{nd}$ node of said diode quad opposite said first node, an op-amp having its output connected to a $3^{rd}$ node of said diode quad and having its non-inverting input connected to a voltage source, and feedback line arranged between a $4^{th}$ node of said diode quad opposite said $3^{rd}$ node and an inverting input of said op-amp.

The diode quad may be said to be configured as a B4 rectifier bridge, with the first current source being connected from +Vb to the negative output of the bridge, said second current source being connected from −Vb to the positive output of the bridge, the op-amp being connected to one AC-input of the bridge and the feedback line being connected between the other AC-input of the bridge and the inverting input of the op-amp.

The V/I source described above may additionally comprise another feedback line arranged between said output of said op-amp and its inverting input and switch means for connecting either one of the feedback lines to said inverting input of said op-amp.

Furthermore, a method for forming a V/I-source (1) is provided. This method comprises providing an electrical circuit having the functionality of a B4 rectifier bridge, providing a first current source from +Vb to the negative output of the bridge, providing a second current source from −Vb to the positive output of the bridge, providing an op-amp to one AC-input of the bridge, and providing a feedback line between the other AC-input of the bridge and the inverting input of the op-amp

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Figure 3:
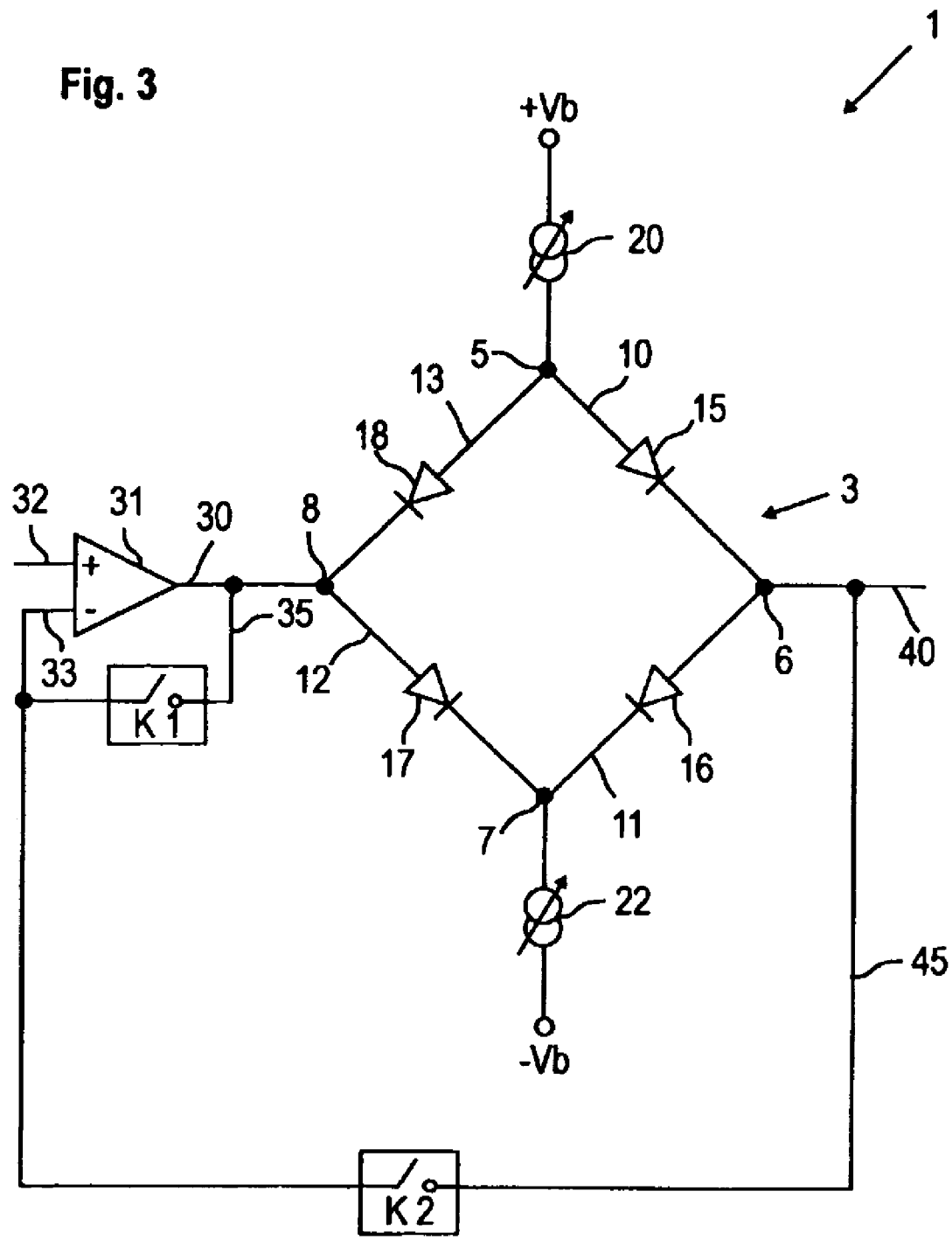
FIG. 3 is a simplified schematic of a V/I source of the present invention.

FIG. 3 shows an embodiment of a V/I source 1 in accordance with the present invention. The V/I source 1 includes a diode quad 3 having four nodes 5 to 8 connected by four respective branches 10 to 13. Each of said branches has at least one element acting as a diode 15 to 18. In the present embodiment, each branch has a diode, even though other types of elements showing the behaviour of a diode may be used instead.

Branches 10 and 13 connect node 5 to nodes 6 and 8, respectively. Branches 11 and 12 connect node 7 to nodes 6 and 8, respectively. Diodes 15 and 18 are arranged in a forward bias direction from node 5 to nodes 6 and 8, respectively. Diodes 16 and 17 are connected in a reverse bias direction from node 7 to nodes 6 and 8, respectively.

Programmable current sources 20 and 22 are connected to opposite ends of said diode quad 3 at nodes 5 and 7, respectively. The programmable current sources 20 and 22 allow predetermined currents to be programmed.

Node 8 of the diode quad 3 is connected to an output 30 of an op-amp 31, which in the present application is a high voltage regulation op-amp. A non-inverting input 32 of the op-amp 31 is connected to a programmable voltage source (not shown) capable of providing a predetermined voltage (force voltage source). An inverting input 33 of said op-amp 31 is connected via a first feedback line 35 to the output 30 of the op-amp 31. A first switch K1 is provided in the feedback line 35, for selectively allowing or blocking feedback of the output voltage of the op-amp 31 to the non-inverting input 33 thereof.

Node 6 of the diode quad is connected to a line 40 which may be connected to a load as for example a device to be tested if the V/I source is used in an automatic test system, as will be described below. Node 6 is also connected to the inverting input of op-amp 31 via a second feedback line 45. A second switch K2 is provided in the feedback line 45, for selectively allowing or blocking feedback of the voltage at node 6 to the non-inverting input of op-amp 31. Instead of providing two separate switches K1 and K2 it is also possible to provide a single switch selectively connecting the inverting input of op-amp 31 to node 6 or 8 of the diode quad 3, respectively.

If switch K1 is closed and switch K2 is opened, the V/I source described above is capable of forcing or sinking a predetermined current to/from a load (such as a DUT) connected to node 6 of the diode quad. When forcing a current from current source 20 to the load, the voltage at node 6 cannot rise beyond the voltage at node 8. If the voltage at node 6 is lower than the voltage at node 8, diodes 15 and 17 are forward biased while diodes 16 and 18 are reverse biased. In this situation, a predetermined current is forced to the load via node 6 and a predetermined current is sinked from the op-amp 31 via node 8. If, however the voltage at node 6 is higher than the voltage at node 8, diodes 15 and 17 become reverse biased and diodes 16 and 18 become forward biased.

Therefore, with switch K1 closed and switch K2 opened, the V/I source may be used for providing a predetermined current, while having an upper voltage limit. Thus, it can be said that the V/I source may be operated in a force current/clamp voltage mode.

If switch K1 is opened and switch K2 is closed, the V/I source described above is capable of providing a predetermined voltage at a load (such as a DUT) connected to node 6 of diode quad 3. The predetermined voltage at node 6 may be set via the programmable voltage source connected to the non-inverting input 30 of op-amp 31 and is regulated via feedback line 45 and op-amp 31. In providing feedback line 45, the voltage at node 6 may be set to a predetermined voltage independent of current flowing from/to current sources 20 and 22

In the above configuration, current sources 20 and 22 do not provide a predetermined current as in the force current mode, as long as the load current in output line 40 is lower than the programmed values of current sources 20 and 22. The output line 40 provides a fixed voltage with a variable current having an upper limit (force voltage/clamp current mode). Thus, it can be said that the V/I source may be operated in a force voltage/clamp current mode.

If in the above configuration the load current becomes higher than the programmed values of current sources 20 and 22, for example in a short circuit situation, the V/I source switches from the force voltage/clamp current mode into a force current/clamp voltage mode, with the programmed value becoming the forced current and the open load voltage becoming the clamp voltage.

Figure 1:
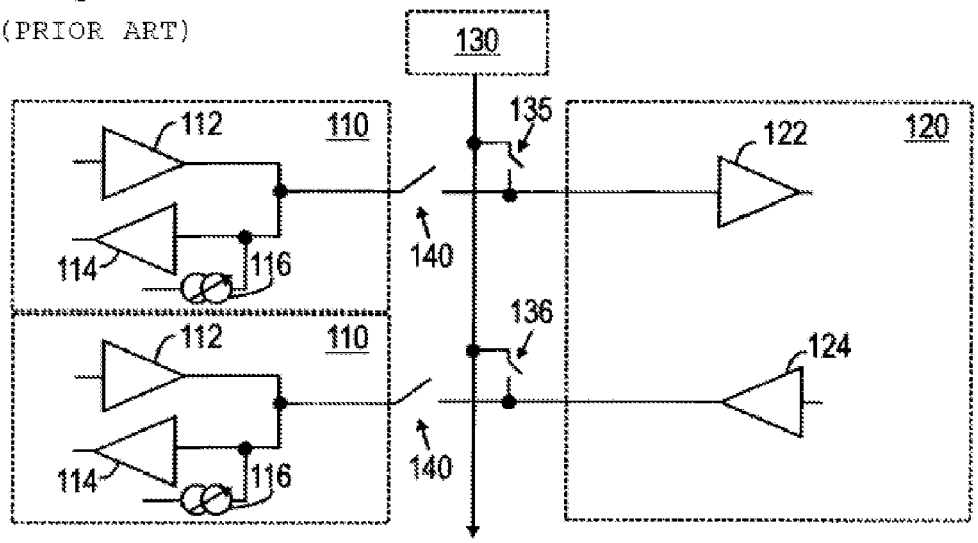
FIG. 1 is a simplified schematic of a pin electronics channel of an automatic test system connected to a device under test.
Figure 2:
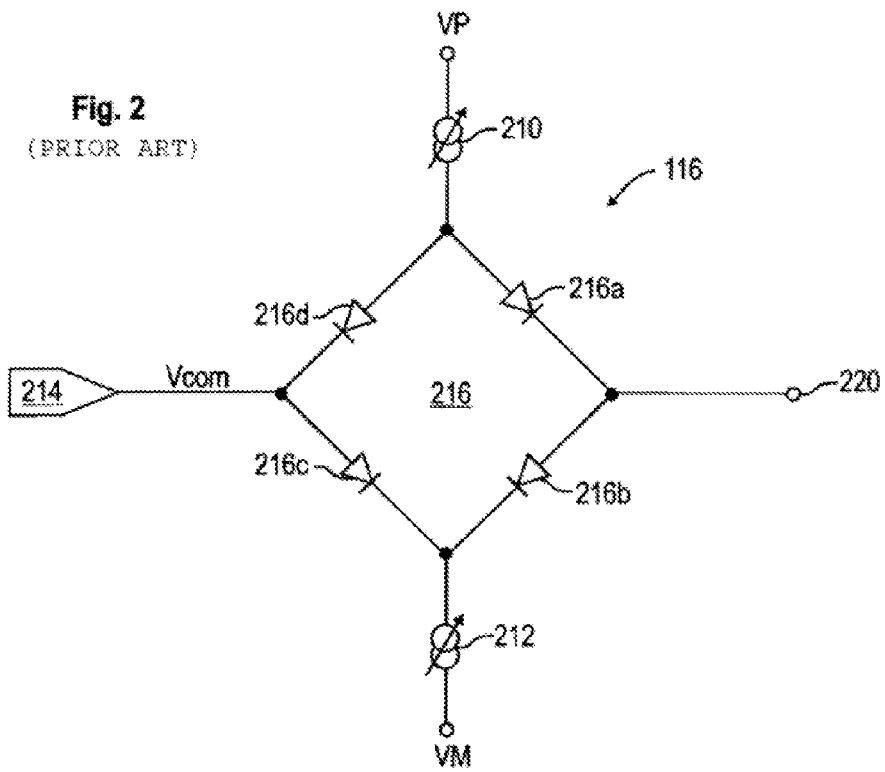
FIG. 2 is a simplified schematic of an active load according to the prior art.
Figure 4:
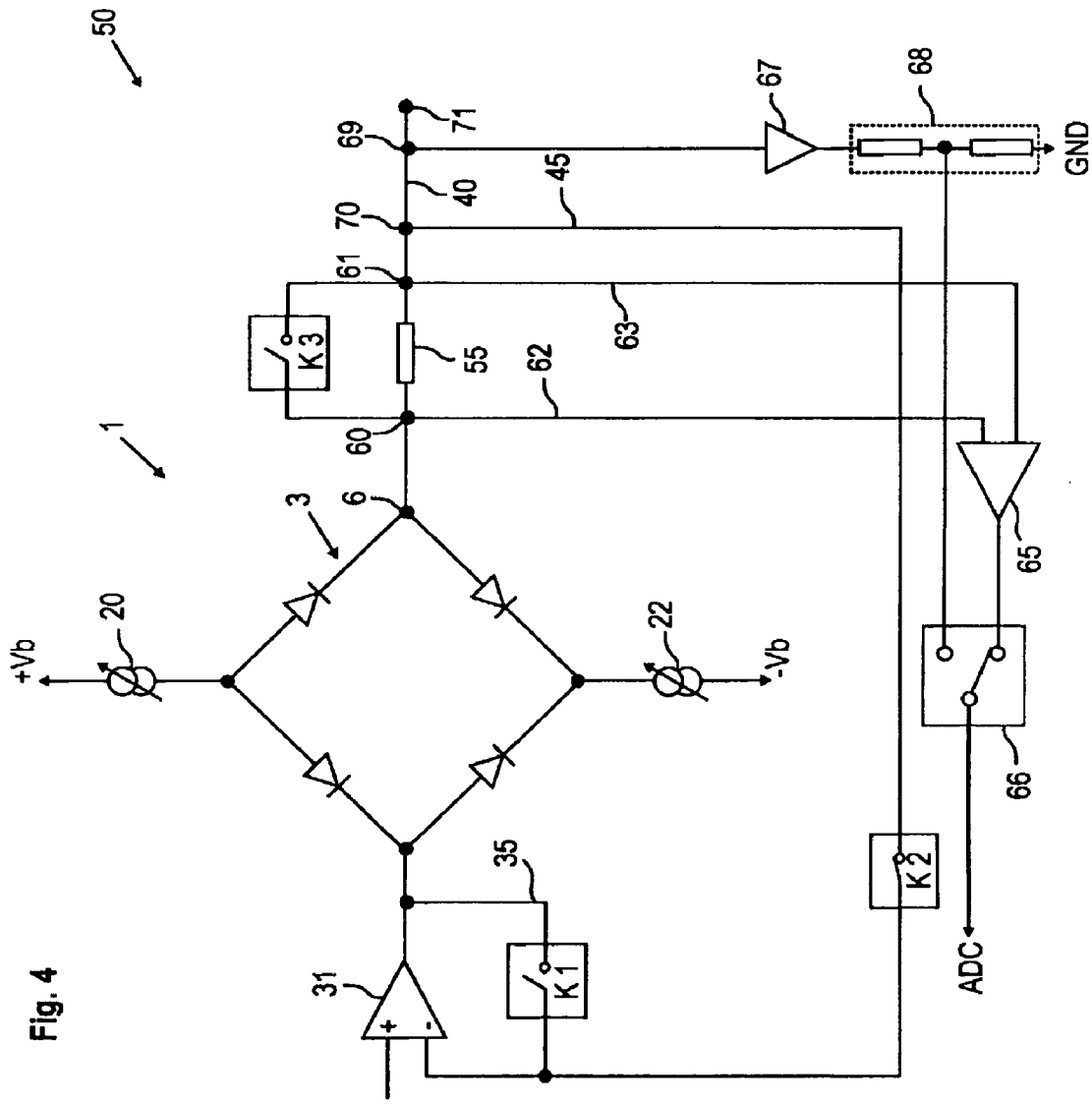
FIG. 4 is a simplified schematic of a first test system incorporating the V/I source of FIG. 3.

The V/I source 1 is particularly useful as source for low output currents in the order of 5 mA and high output voltages in the order of 45V. FIG. 4 shows the V/I source 1 described above incorporated into a test system 50 for automatically testing electric devices. The test system 50 can have the schematic set up shown in FIG. 1, including a driver, a detector and a load, which is the V/I source 1. The test system is capable of ensuring that integrated circuits under test provide the proper output voltages in response to a given input. Furthermore, the test system is also capable of measuring electrical properties, such as the resistance, of DUT's.

FIG. 4 uses the same reference signs used in FIG. 3 for elements that are identical or similar. The test system provides a resistor 55 in line 40 connected to node 6 of the diode quad. The resistor 55 is a so called shunt resistor having a precisely known low resistance. In parallel to said resistor 55, a third switch K3 is provided. The third switch K3 enabling bypassing of the said resistor 55.

On opposite ends of said resistor 55 nodes 60 and 61 are provided, which are connected via respective lines 62, 63 to a differential amplifier 65 capable of measuring the voltage drop across resistor 55. The output of differential amplifier 65 is connected to a switch 66, the output of which is connected to an analog to digital Converter (ADC).

Output line 40 is also connected to a buffer 67 in series with a voltage divider 68 at a node 69. The output of the voltage divider also being connected to switch 66. Switch 66 thus being capable of switching the ADC between the differential amplifier and the voltage divider. The Voltage divider being provided to bring the voltage in output line 40 to the level required for the ADC.

If the ADC is connected to differential amplifier 65 the components enable measurement of the current flowing through output line 40 connected to the DUT. If the ADC is connected to the voltage divider 68, the components enable a voltage measurement in output line 40.

The feedback line 45 is connected to line 40 at node 70, between nodes 61 and 69.

In FIG. 4 switches K1 and K3 are shown open and switch K2 is closed, which is a configuration which may be used for parametric tests on a DUT. In this configuration the voltage in line 40 will be regulated via op-amp 31 to a desired voltage at node 70, as long as the load current in output line 40 is lower than the programmed values of current sources 20 and 22. The circuit is thus operating in a force voltage mode. At the same time switch 66 connects the output of differential amplifier 65 to the ADC. In this configuration current sources 20 and 22 will provide a the required load current in output line 40 as long as it is below the programmed value thereof. Thus load current is limited/clamped by the programmed value of current sources 20 and 22. If line 40 is connected to a DUT at node 71, the current drawn by DUT at a given voltage may be derived by determining the voltage drop across resistor 55 having a known resistance.

In the configuration as shown in FIG. 4 the test system 50 is typically operating in a force voltage/clamp current mode, which allows measuring the current drawn by a DUT. Clamping the current as described above in the force voltage mode protects the DUT and the test system. In a short circuit situation, where the load current would usually rise to high levels, the programmed currents in the current sources act as an upper limit to the current. If this limit is reached, the V/I source switches from the force voltage/clamp current mode into a force current mode, with the programmed value becoming the forced current, to thereby protect the test circuit and the DUT.

If in the configuration of FIG. 4 switches K1 and K3 were closed and switch K2 were opened, test system 50 could be used for forcing or sinking a predetermined current to/from a DUT connected to node 71 depending on a voltage output of the DUT. In such a configuration, functional tests could be performed. If no functional tests are required, switches K1 and K2 and the respective feedback/bypass lines could be eliminated.

Figure 5:
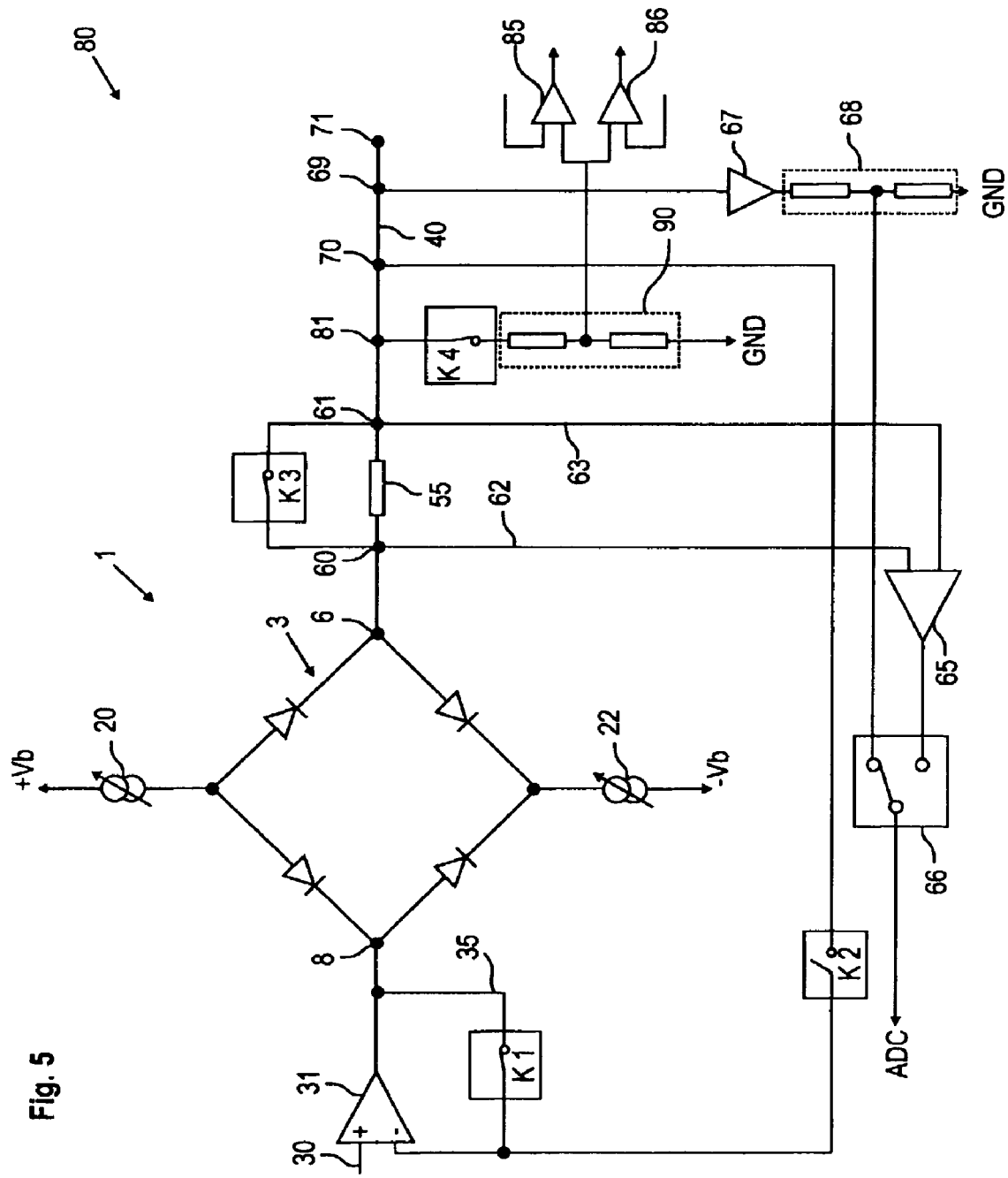
FIG. 5 is a simplified schematic of a second test system incorporating the V/I source of FIG. 3.

FIG. 5 shows the V/I source as described above incorporated into a second test system 80 for automatically testing electric devices. The test system 80 again can have the schematic set up shown in FIG. 1 including a driver, detector and a load, which is the V/I source 1 of the present invention. In FIG. 5 the same reference signs as used in the previous figures are used for elements that are identical or similar.

As can be seen in FIG. 5, the test system 80 comprises all elements of test system 50 shown in FIG. 4. These elements will not be described in detail in order to avoid undue repetition.

The test system 80 additionally comprises a node 81, provided between nodes 61 and 70. Node 81 is connected to respective inputs of comparators 85 and 86. The free input of comparator 85 is connected to a voltage source providing a voltage corresponding to the expected high voltage output of a DUT.

The free input of comparator 86 is likewise connected to a voltage source providing a voltage corresponding to the expected low output voltage of a DUT. Furthermore, a high ohmic resistive divider 90 is provided.

The test system 80, shown in FIG. 5, is shown in a configuration, where switches K1, K3 and K4 are closed, while switch K2 is opened. This is a configuration which may be used for functional tests on a DUT. In this configuration, current sources 20 and 22 are programmed to the load levels expected during operation of the DUT and it can be said that they are in a force current mode. In this mode a predetermined current is sourced to or sinked from an output of a DUT depending on the voltage provided by said output, which is seen at node 6 of diode quad 3. Node 8 of the diode quad 3 is regulated to the voltage provided to the non-inverting input 30 of op-amp 31 via feedback line 35. Thus, the voltage at the output of the DUT determines whether current is sourced to the DUT or is sinked therefrom. Since switch K4 is closed, comparators 85,86 can provide a quick verification of high and low DUT output levels at predefined load conditions.

The diode quad 3 used in the V/I source 1 may include greater numbers of diodes, e.g., the constituent diodes may be replaced with two or more diodes in series. Diodes are preferred, but not strictly required. In addition, devices not commonly regarded as diodes, such as transistors or integrated circuits, which inherently include diode-like junctions, or active circuits which act like real or ideal diodes, may also be used.

Therefore, while the invention has been particularly shown and described with reference to the preferred embodiments thereof, it will be understood by those skilled in the art that various changes in form and detail may be made therein without departing from the spirit and scope of the invention.

What is claimed is:

1. A voltage/current (V/I) source comprising:
   circuitry comprising first, second, third and fourth nodes;
   a first current source electrically connected to the first node;
   a second current source electrically connected to the second node, the third and fourth nodes being between the first and second nodes;
   an operational amplifier (op-amp) having an output, an inverting input, and a non-inverting input, the output being electrically connected to the third node, and the non-inverting input being electrically connected to a voltage source;
   a feedback line between the fourth node and the inverting input;
   a first circuit element between the first and fourth nodes;
   a second circuit element between the second and fourth nodes;
   a third circuit element between the first and third nodes; and
   a fourth circuit element between the second and third nodes;
   wherein the first, second, third and fourth circuit elements are configurable to permit or restrict current flow.

2. The V/I source of claim 1, wherein the feedback line comprises a first feedback line, and wherein the V/I source further comprises:
   a second feedback line between the output of the op-amp and the inverting input; and
   switching devices configured to electrically connect the first feedback line or the second feedback line to the inverting input of the op-amp.

3. The V/I source of claim 1, wherein at least one of the first and second current sources is programmable.

4. The V/I source of claim 3, wherein the first and second current sources are configured to be programmed independently.

5. The V/I source of claim 1, wherein the first, second, third, and fourth circuit elements comprise diodes.

6. A test system configured to test one or more electronic devices, comprising:
   the V/I source of claim 1;
   wherein the fourth node of the circuitry is connectable to a device under test (DUT), and wherein the circuitry comprises a diode-quad circuit.

7. The test system of claim 6, further comprising:
   a voltage measurement device electrically connected to the fourth node of the diode-quad circuit.

8. The test system of claim 6, further comprising:
   a resistive device electrically connected to the fourth node.

9. The test system of claim 8, further comprising:
   a switch that is electrically parallel to the resistive device.

10. The test system of claim 8, further comprising:
    a current measurement device electrically connected to different ends of the resistive device.

11. The test system of claim 6, further comprising:
    at least one comparator configured to be electrically connected to the fourth node of the diode-quad circuit.

12. The test system of claim 11, wherein the at least one comparator comprises a pair of comparators.

13. The test system of 11, further comprising:
    a switch between the at least one comparator and the fourth node of the diode-quad circuit, the switch being operable to effect, or to prevent, electrical connection of the at least one comparator to the fourth node.

14. The test system of claim 11, further comprising:
    a voltage divider that is electrically connected to the at least one comparator, at least part of the voltage divider being between the at least one comparator and the fourth node of the diode-quad circuit.

15. The test system of claim 7, further comprising:
    a switch for selectively electrically connecting the voltage measurement device to the fourth node of the diode-quad circuit or to an output of a current measurement device.

16. The test system as set forth in claim 7, further comprising:
    a voltage divider, at least part of which is electrically connected between the voltage measurement device and the fourth node of the diode-quad circuit.

17. A method of forming a voltage/current (V/I) source, comprising:
    providing an electrical circuit comprising a diode bridge rectifier, the electrical circuit comprising first, second, third and fourth nodes;
    connecting a first current source to the first node of the electrical circuit;
    connecting a second current source to the second node of the electrical circuit;
    providing an output of an operational amplifier (op-amp) to the third node of the electrical circuit; and
    providing a feedback line between the fourth node of the electrical circuit and an inverting input of the op-amp.

18. The method of claim 17, wherein the electrical circuit comprises a diode-quad circuit.

19. The method of claim 17, wherein the feedback line comprises a first feedback line, and wherein the method further comprises:
    providing a second feedback line between the output of the op-amp and an inverting input of the op-amp; and
    connecting the first feedback line or the second feedback line to the inverting input of the op-amp.

20. The method of claim 17, wherein at least one of the first and second current sources is programmable to provide an amount of current.

21. The method of claim 20, wherein the first and second current sources are independently programmable.

22. A method for testing an electronic device, comprising:
    connecting the fourth node of the V/I source of claim 1 to a device under test (DUT); and
    monitoring behavior of the V/I source based on an output of the DUT.

23. The method of claim 22, wherein the feedback line comprises a first feedback line, and wherein the V/I source further comprises a second feedback line between the output of the op-amp and the inverting input; and wherein the first feedback line or the second feedback line is electrically connected to the inverting input of the op-amp, wherein which feedback line is connected is dependent on a device to be tested and/or a test to be performed.

24. The method of claim 22, wherein monitoring comprises measuring a voltage drop across a first resistor electrically connected to the fourth node.

25. The method of claim 22, wherein monitoring comprises measuring a voltage at the fourth node.

26. The method of claim 25, wherein the voltage at the fourth node is measured using comparators.

* * * * *